United States Patent
Sakimura et al.

(10) Patent No.: US 7,885,131 B2
(45) Date of Patent: Feb. 8, 2011

(54) RESISTANCE CHANGE SEMICONDUCTOR MEMORY DEVICE AND METHOD OF READING DATA WITH A FIRST AND SECOND SWITCH CIRCUIT

(75) Inventors: Noboru Sakimura, Tokyo (JP); Takeshi Honda, Tokyo (JP); Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 488 days.

(21) Appl. No.: 11/815,325

(22) PCT Filed: Feb. 1, 2006

(86) PCT No.: PCT/JP2006/301651
§ 371 (c)(1),
(2), (4) Date: Sep. 21, 2007

(87) PCT Pub. No.: WO2006/085459
PCT Pub. Date: Aug. 17, 2006

(65) Prior Publication Data
US 2008/0285360 A1    Nov. 20, 2008

(30) Foreign Application Priority Data
Feb. 8, 2005    (JP) .............................. 2005-032237

(51) Int. Cl.
*G11C 7/02* (2006.01)
(52) U.S. Cl. ............................ 365/210.12; 365/210.15; 365/210.1; 365/189.15; 365/189.07; 365/189.09; 365/148; 365/158; 365/163
(58) Field of Classification Search ............ 365/210.12, 365/210.15, 210.1, 189.15, 189.07, 189.09, 365/148, 158, 163
See application file for complete search history.

(56) References Cited

U.S. PATENT DOCUMENTS 5,995,421 A * 11/1999 McKenny ............... 365/189.07

(Continued)

FOREIGN PATENT DOCUMENTS

JP         7-192476 A        7/1995

(Continued)

OTHER PUBLICATIONS

John DeBrosse, et al,: "A High-Speed 128-kb MRAM Core for Future Universal Memory Applications"; IEEE Journal of Solid-State Circuits, vol. 4, No. 4, Apr. 2004, pp. 678-683.

*Primary Examiner*—Andrew Q Tran
(74) *Attorney, Agent, or Firm*—Dickstein Shapiro, LLP

(57) ABSTRACT

A semiconductor memory device of the present invention comprises a memory array and a read circuit that reads data of a selected cell. The memory array includes a plurality of memory cells and a reference cell each having a memory element that stores data based on change in resistance value. The read circuit includes: a voltage comparison unit that compares a value corresponding to a sense current from the selected cell with a value corresponding to a reference current from the reference cell; a first switch; and a second switch. Both of the first and second switches are provided at a subsequent stage of a decoder and at a preceding stage of the voltage comparison unit. The second switch circuit controls input of the value corresponding to the sense current to the voltage comparison unit, while the first switch circuit controls input of the value corresponding to the reference current to the voltage comparison unit.

11 Claims, 7 Drawing Sheets

U.S. PATENT DOCUMENTS

| | | | |
|---|---|---|---|
| 6,317,376 B1 * | 11/2001 | Tran et al. | 365/210.12 |
| 6,826,094 B1 * | 11/2004 | Perner et al. | 365/189.07 |
| 6,885,579 B2 * | 4/2005 | Sakimura et al. | 365/158 |
| 6,954,392 B2 * | 10/2005 | Baker | 365/209 |
| 7,085,166 B2 * | 8/2006 | Iwase et al. | 365/185.2 |

FOREIGN PATENT DOCUMENTS

| | | |
|---|---|---|
| JP | 11-026727 A | 1/1999 |
| JP | 2002-008386 A | 1/2002 |
| JP | 2002-197853 A | 7/2002 |
| JP | 2002-533863 A | 10/2002 |
| JP | 2003-151262 A | 5/2003 |
| JP | 2005-501370 A | 1/2005 |
| JP | 2004-039150 A | 2/2005 |

* cited by examiner

RESISTANCE CHANGE SEMICONDUCTOR MEMORY DEVICE AND METHOD OF READING DATA WITH A FIRST AND SECOND SWITCH CIRCUIT

TECHNICAL FIELD

The present invention relates to a semiconductor memory device and a method of reading data from the semiconductor memory device. In particular, the present invention relates to a semiconductor memory device that stores data based on a resistance value of a memory element, and a method of reading data from the semiconductor memory device.

BACKGROUND ART

In recent years, research and development of a nonvolatile memory are being actively carried out. What particularly attracts attention is a resistance change memory that stores information as a resistance value of a memory element. The resistance change memory is exemplified by a magnetic random access memory (MRAM) that performs data writing by using magnetic field, a phase change memory (ovonic unified memory: OUM) that performs data writing by using heat, a resistance random access memory (Resistance RAM: RRAM) that performs data writing by using voltage.

Many of the nonvolatile resistance change memories are expected to be alternatives to an existing storage or a volatile RAM. For example, the MRAM, which is characterized by a high-speed operation and a large number of rewritable times, is expected to be alternative to a volatile RAM such as a DRAM, an SRAM or the like. However, since it uses a peculiar read principle that senses resistance, some problems are to be resolved in circuit in order to satisfy input-output compatibility with the existing devices.

For example, many of the existing RAMs are provided with a high-speed read operation called page mode or burst mode, as is well known to those skilled in the art. In such the read operation, data of memory cells at a plurality of addresses are read out at a time and the result is sequentially output with high speed. To achieve such the mode, it is necessary to place a large number of read circuits (sense amplifiers). Considering a case where input-output pins are 16 bits and a 16-words burst read operation is carried out, for example, at least 256 read circuits are necessary. As for the MRAM, however, an area of the read circuit is large because data signals of "0" and "1" are small, and thus it is not easy to place a large number of read circuits.

A technique relating to a read circuit of an MRAM is disclosed, for example, in a document: J. DeBrosse, et al., "A High-Speed 128-kb MRAM Core for Future Universal Memory Applications", IEEE JOURNAL OF SOLID-STATE CIRCUITS, VOL. 4, No. 4, APRIL 2004, pp. 678-683. FIG. 1 shows a configuration of the MRAM that includes the read circuit according to the relevant technique. The MRAM is provided with a memory array 108, a row decoder 107, a column decoder 106, and read circuits 105a and 105b. The memory array 108 has a plurality of read word lines 121, a plurality of bit lines 122, a plurality of reference bit lines 122r, a plurality of memory cells 131, and a plurality of reference cells 132a and 132b.

The plurality of read word lines 121 extend in an X-direction. The plurality of bit lines 122 extend in a Y-direction. The plurality of reference bit lines 122r extend in the Y-direction. The plurality of memory cells 131 are provided at respective intersections of the plurality of read word lines 121 and the plurality of bit lines 122. The plurality of reference cells 132b and 132a are provided at respective intersections of the plurality of read word lines 121 and the plurality of reference bit lines 122r. In a read operation, the row decoder 107 selects a selected read word line 121 from the plurality of read word lines 121. In the read operation, the column decoder 106 selects selected bit lines 122 and the reference bit lines 122r from the plurality of bit lines 122 and 122r. Consequently, memory cells 131 provided at respective intersections of the selected read word line 121 and the selected bit lines 122 are selected as selected cells 131 at the time of the read operation. Also, the reference cells 132b and 132a provided at respective intersections of the selected read word line 121 and the reference bit lines 122r are selected as selected reference cells 132b and 132a. The selected bit lines 122 and the reference bit lines 122r are connected to the read circuits 105b and 105a through the column decoder 106. As a result, data of the selected cells 131 and the reference cells 132b and 132a are read by the read circuits 105b and 105a.

In the above MRAM, the reference cell 132b has a resistance value Rmin related to data "0", the reference cell 132a has a resistance value Rmax related to data "1", and the two read circuits 105b and 105a are provided for the respective reference cells 132b and 132a. The read circuits 105b and 105a have current-voltage conversion circuits 102b and 102a and sense amplifiers 104b and 104a, respectively. The current-voltage conversion circuit 102b (102a) outputs a sense voltage Vs that is proportional to a current flowing through the memory cell 131 and a reference voltage Vref that is proportional to a current flowing through the reference cell 132b (132a). The sense amplifier 104b (104a) makes a comparison between the sense voltage Vs and the reference voltage Vref. Inputs/outputs on the sides of reference cells of the current-voltage conversion circuits 102b and 102a are short-circuited to each other between the read circuits 105b and 105a. It is therefore possible to set the reference voltage Vref at an intermediate voltage between the sense voltage Vs(0) corresponding to data "0" and the sense voltage Vs(1) corresponding to data "1".

According to the above configuration, the reference cell 132b, 132a is necessary for every read circuit 105b, 105a. Therefore, when a large number of read circuits 105b, 105a are placed, an occupancy rate of the memory cells 131 which a user can freely use for data reading/writing is decreased. To avoid this problem, a circuit technique is essential with which the reference cell 132b, 132a can be used by a plurality of read circuits. In this case, each reference voltage Vref is interfered and thus fluctuated, by the amplification operation of the sense amplifier 104b, 104a in every read circuit 105b, 105a. Since the data signals of "0" and "1" are small in the MRAM, the fluctuation due to the interference cannot be ignored. The above-mentioned interference greatly deteriorates reliability of data reading in the MRAM. Although this problem can be avoided to a certain extent by using a sense amplifier with high-impedance input, a circuit system of the sense amplifier is limited. In addition, when a large number of sense amplifiers operate simultaneously, the read reliability is deteriorated due to influence of noises of power supply voltage and so forth. As explained above, it is not easy to place a large number of read circuits in the MRAM. A technique is desired which can make a large number of read circuits operate simultaneously without deteriorating the read reliability.

Moreover, in the sense operation, the memory cell 131 and the reference cell 132b, 132a are electrically connected to each other through the sense amplifier 104b, 104a. For this reason, an improper voltage may be applied to the memory cell 131 and the reference cell 132b, 132a due to the amplification operation of the sense amplifier 104b, 104a. A technique is desired which prevents that the improper voltage is applied to the memory cell 131 and the reference cell 132b, 132a in the sense operation.

In the above description, the MRAM is explained as an example. Similarly, such the technique is also desired to other resistance change memories that are based on the similar read principle. By the way, the followings are known as other relevant techniques relating to the nonvolatile memory.

Japanese Laid Open Patent Application JP-P2004-39150A discloses a technique to eliminate influence of sneak path current and improve reliability of detecting data stored in memory cells of an MRAM. A read circuit of the MRAM includes an offset elimination circuit and a data detection circuit. The offset elimination circuit generates a current difference signal that corresponds to difference between a sense current flowing through a selected bit line when a voltage is applied between a selected word line and the selected bit line and an offset component current flowing through a dummy bit line when a voltage is applied between the selected word line and the dummy bit line. Based on the current difference signal, the data detection circuit detects memory data stored in a selected cell provided between the selected word line and the selected bit line.

Japanese Laid Open Patent Application JP-A-Heisei 7-192476 discloses a nonvolatile ferroelectric memory. In the nonvolatile ferroelectric memory, a reference potential generation unit generates a reference potential based on signal potentials of logics 1 and 0, and a potential retention unit holds the reference potential. In a read operation, a potential supply unit generates the reference potential to one data line based on the held potential. Information is detected through a comparison between a signal potential read out to the other data line and the reference potential.

Japanese Laid Open Patent Application JP-P2003-151262A discloses a method of reading data from an MRAM. The method includes a step of flowing a first read current through a memory cell, a step of writing a write data that has a predetermined value into the memory cell, a step of flowing a second read current through the memory cell into which the write data is written, and a step of judging data of the memory cell by detecting difference between the first and second read currents.

Japanese Laid Open Patent Application JP-A-Heisei 11-26727 discloses a nonvolatile semiconductor memory. The nonvolatile semiconductor memory has a memory cell consisting of a MOS transistor having a floating gate, a sense amplifier, a reference cell having the same structure as the memory cell, a control voltage generation circuit that generates a reference cell control voltage applied to the reference cell, and a reference voltage generation circuit that generates a reference voltage from the output of the reference cell. The floating gate and a control gate of the reference cell are short-circuited to each other.

National publication of the translated version of PCT application JP-P2002-533863 discloses an MRAM. The MRAM has a magnetic memory cell connected in series to a first conductive wiring, a reference magnetic memory cell connected in series to a second conductive wiring, and a resistance element connected in series to the reference magnetic memory cell. The magnetic memory cell has a magneto-resistance that is switched between a minimum value and a maximum value. The reference memory cell has a predetermined magneto-resistance. Total resistance of the reference magnetic memory cell and the resistance element is set between the minimum value and the maximum value.

DISCLOSURE OF INVENTION

An object of the present invention is to provide a technique which can make a large number of read circuits operate simultaneously without deteriorating reliability of data reading in a semiconductor memory device.

Another object of the present invention is to provide a technique with which a large number of read circuits can be placed without increasing reference cells in a semiconductor memory device.

In a first aspect of the present invention, a semiconductor memory device comprises: a memory array including a plurality of memory cells and a reference cell each of which has a memory element that stores data based on change in resistance values; and a read circuit that reads out data of a selected cell selected from the plurality of memory cells. The read circuit includes a voltage comparison unit, a first switch circuit, and a second switch circuit. The voltage comparison unit compares a sense current flowing through the selected cell with a reference current flowing through the reference cell, or compares a value corresponding to the sense current with a value corresponding to the reference current. The first switch circuit and the second switch circuit are provided at a subsequent stage of a decoder relating to the selection of the selected cell and at a preceding stage of the voltage comparison unit. The first switch circuit controls input of the reference current or the value corresponding to the reference current to the voltage comparison unit by switching on or off. The second switch circuit controls input of the sense current or the value corresponding to the sense current to the voltage comparison unit by switching on or off.

According to the above configuration, it is possible by using the first switch circuit and the second switch circuit to electrically separate the generation (occurrence) of the sense current and the reference current from the comparison between the sense current and the reference current in the voltage comparison unit. The same applies to a case where the value corresponding to the sense current and the value corresponding to the reference current are used. Therefore, it is prevented that the reference cell and the selected cell are electrically connected to each other through the voltage comparison unit during a sense operation or the like. It is prevented that unnecessary voltage is applied to each of the memory cells.

The above-mentioned semiconductor memory device can further comprise a first current-voltage conversion circuit. The first current-voltage conversion circuit is provided at a subsequent stage of the decoder and outputs a reference voltage based on the reference current flowing through the reference cell. The read circuit can further include a second current-voltage conversion circuit. The second current-voltage conversion circuit is provided at a subsequent stage of the decoder and outputs a sense voltage based on the sense current flowing through the selected cell. The first switch circuit is provided between the first current-voltage conversion circuit and the voltage comparison unit. The second switch circuit is provided between the second current-voltage conversion circuit and the voltage comparison unit. The voltage comparison unit compares the sense voltage and the reference voltage. According to this configuration, it is possible to make it easy to deal with a signal indicating the comparison result, since the sense voltage and the reference voltage are used as the inputs to the voltage comparison unit.

In the above-mentioned semiconductor memory device, the number of the read circuit can be plural. Each of a plurality of selected cells which are selected from the plurality of memory cells is related to any of the plurality of read circuits. Each of the read circuits is provided with the first switch circuit and the second switch circuit. In this case, the one reference voltage is shared by the plurality of read circuits. It is possible to electrically separate the generation (occurrence) of the sense voltage and the reference voltage from the comparison between the sense voltage and the reference voltage in the voltage comparison unit. As a result, it is prevented that the reference voltage is interfered and thus fluctuated by the amplification operation of the voltage comparison unit. Therefore, the reliability of data reading can be prevented from being deteriorated. It is also possible to place a large number of read circuits without increasing the number of the reference cells.

In the above-mentioned semiconductor memory device, the reference cell can include a first reference cell in which the resistance value is set to a first state ("0") and a second reference cell in which the resistance value is set to a second state ("1"). When the first reference cell and the second reference cell are selected simultaneously, the first current-voltage conversion circuit outputs a voltage corresponding to half the sum of a reference current flowing through the first reference cell and a reference current flowing through the second reference cell as the above-mentioned reference voltage. It is possible to improve reliability of the reference voltage by using the two kinds of reference cells.

In the above-mentioned semiconductor memory device, each of the plurality of read circuits may further include an amplification circuit that is provided at a preceding stage of the voltage comparison unit. The amplification circuit amplifies the sense voltage and the reference voltage such that a difference between the sense voltage and the reference voltage is increased. Since the difference between the sense voltage and the reference voltage is amplified, reliability of the comparison in the voltage comparison unit is improved.

In the above-mentioned semiconductor memory device, when the first current-voltage conversion circuit is connected to the reference cell and each of the plurality of read circuits is connected to the related one of the plurality of selected cells, the first switch circuit and the second switch circuit are turned on in each read circuit. After that, the first switch circuit and the second switch circuit are turned off. After that, the voltage comparison unit makes a comparison between the sense voltage and the reference voltage. By the ON/OFF operation of the first switch circuit and second switch circuit, it is possible to electrically separate the generation (occurrence) of the sense voltage and the reference voltage from the comparison between the sense voltage and the reference voltage in the voltage comparison unit.

In the above-mentioned semiconductor memory device, the first switch circuit may include a first switch element and a first capacitor. The first switch element is provided between the input side and the output side. One terminal of the first capacitor is grounded, while the other terminal is connected to the output side. Also, the second switch circuit may include a second switch element and a second capacitor. The second switch element is provided between the input side and the output side. One terminal of the second capacitor is grounded, while the other terminal is connected to the output side. By the ON operation of the first switch circuit and the second switch circuit, the reference voltage and the sense voltage that are generated (occurred) are temporarily stored in the first capacitor and the second capacitor, respectively. After each current-voltage conversion circuit is electrically separated by the OFF operation of the first switch circuit and second switch circuit, the voltage comparison unit compares the sense voltage and the reference voltage that are stored. Consequently, the reference voltage is prevented from being interfered and fluctuated, which makes it possible to maintain the reliability of data reading.

In the above-mentioned semiconductor memory device, the first current-voltage conversion circuit can output the reference voltage simultaneously to the plurality of read circuits in a sense operation. As a result, one reference cell can be shared by the plurality of read circuits.

In the above-mentioned semiconductor memory device, the second switch circuit may further include a third capacitor whose one terminal is grounded, and a third switch element that is provided between the input side of the second switch and the other terminal of the third capacitor. When the one reference cell is shared by the plurality of read circuits, settling time can be reduced by adjusting a time constant of the second switch circuit by using the third capacitor.

In the above-mentioned semiconductor memory device, when the second switch element is in the connected state at the time of the sense operation, the third switch element is also in the connected state. The settling time can be reduced by using the third capacitor and the second capacitor at the same time.

In the above-mentioned semiconductor memory device, let us consider a case where the number of read circuits to which the reference voltage is input from the first current-voltage conversion circuit in the sense operation is N (N is an integer not less than 2). Also, the capacitance value of the first capacitor and the second capacitor is assumed to be C. In this case, the capacitance value of the third capacitor is set to C(N−1). To set the capacitance value of the third capacitor in this manner is effective in the reduction of the settling time.

In the above-mentioned semiconductor memory device, the memory element may be a magneto-resistance element whose resistance value changes depending on orientation of spontaneous magnetization. Also, the memory element may be a phase change element whose resistance value changes due to change in crystal state by heating.

In a second aspect of the present invention, a method of reading data from a semiconductor memory device is provided. The semiconductor memory device comprises: a memory array including a plurality of memory cells and at least one reference cell each of which has a memory elements that stores data based on change in resistance value; a plurality of read circuits that respectively read out data of a plurality of selected cells which are selected from the plurality of memory cells; and a first current-voltage conversion circuit that outputs a reference voltage corresponding to a reference current flowing through the at least one reference cell. Each of the plurality of read circuits includes a second current-voltage conversion circuit, a voltage comparison unit, a first switch circuit, and a second switch circuit. The second current-voltage conversion circuit outputs a sense voltage corresponding to a sense current flowing through related one of the plurality of selected cells. The voltage comparison unit compares the sense voltage with the reference voltage. The first switch circuit is provided between the first current-voltage conversion circuit and the voltage comparison unit, and controls connection between the first current-voltage conversion circuit and the voltage comparison unit by switching on and off. The second switch circuit is provided between the second current-voltage conversion circuit and the voltage comparison unit, and controls connection between the second current-voltage conversion circuit and the voltage comparison unit by switching on and off.

The method of reading data from the semiconductor memory device includes: (a) the second current-voltage conversion circuit converts the sense current to the sense voltage and outputs the sense voltage; (b) the first current-voltage conversion circuit converts the reference current to the reference voltage and outputs the reference voltage to the plurality of read circuits; (c) the first switch circuit and the second switch circuit are turned on; (d) the first switch circuit and the second switch circuit are turned off; and (e) the voltage comparison unit compares the sense voltage with the reference voltage.

The first switch circuit and the second switch circuit are provided in each of the read circuits. Although the one reference voltage is shared by the plurality of read circuits, it is possible to electrically separate the steps (a, b, c) of outputting the sense voltage and the reference voltage from the step (e) of comparing the sense voltage and the reference voltage in the voltage comparison unit. As a result, it is prevented that the reference voltage is interfered and thus fluctuated by the amplification operation of the voltage comparison unit. Therefore, the reliability of data reading can be prevented from being deteriorated. It is possible to make a large number of read circuits operate simultaneously without deteriorating the read reliability.

The reference cell may include a first reference cell in which the resistance value is set to a first state ("0") and a second reference cell in which the resistance value is set to a second state ("1"). In the above-mentioned (b) step, when the first reference cell and the second reference cell are selected simultaneously, a voltage corresponding to half the sum of a reference current flowing through the first reference cell and a reference current flowing through the second reference cell is output as the reference voltage.

Each of the plurality of read circuits may further include an amplification circuit that is provided at a preceding stage of the voltage comparison unit. In this case, the read method according to the present invention further includes: (f) the amplification circuit amplifies the sense voltage and the reference voltage such that a difference between the sense voltage and the reference voltage is increased.

The first switch circuit can include: a first switch element that is provided between the input side and the output side; and a first capacitor whose one terminal is grounded and the other terminal is connected to the output side. The second switch circuit can include: a second switch element that is provided between the input side and the output side; and a second capacitor whose one terminal is grounded and the other terminal is connected to the output side. In this case, the above-mentioned (c) step includes: (c1) turning on the second switch element; (c2) charging the second capacitor with the sense voltage; (c3) turning on the first switch element; and (c4) charging the first capacitor with the reference voltage. Also, the above-mentioned (e) step includes: (e1) the voltage comparison unit compares a voltage of the second capacitor with a voltage of the first capacitor.

The above-mentioned (b) step may include: (b2) the first current-voltage conversion circuit outputs the above-mentioned reference voltage simultaneously to the plurality of read circuits.

The above-mentioned second switch circuit may further include a third capacitor whose one terminal is grounded, and a third switch element that is provided between the input side of the second switch circuit and the other terminal of the third capacitor. In this case, the above-mentioned (c) step includes: (c11) turning on the third switch element when the second switch element is turned on.

In the above-mentioned method of reading data from the semiconductor memory device, the memory element may be a magneto-resistance element whose resistance value changes depending on orientation of spontaneous magnetization. Also, the memory element may be a phase change element whose resistance value changes due to change in crystal state by heating.

As described above, it is possible to make a large number of read circuits operate simultaneously without deteriorating the reliability of data reading, according to the semiconductor memory device and the method of reading data therefrom of the present invention. In addition, it is possible to place a large number of read circuits without increasing the reference cells.

BEST MODE FOR CARRYING OUT THE INVENTION

A semiconductor memory device and a method of reading data from the semiconductor memory device according to exemplary embodiments of the present invention will be described below with reference to the attached drawings. In the description below, an MRAM is explained as an example of the semiconductor memory device.

First Embodiment

Figure 1:
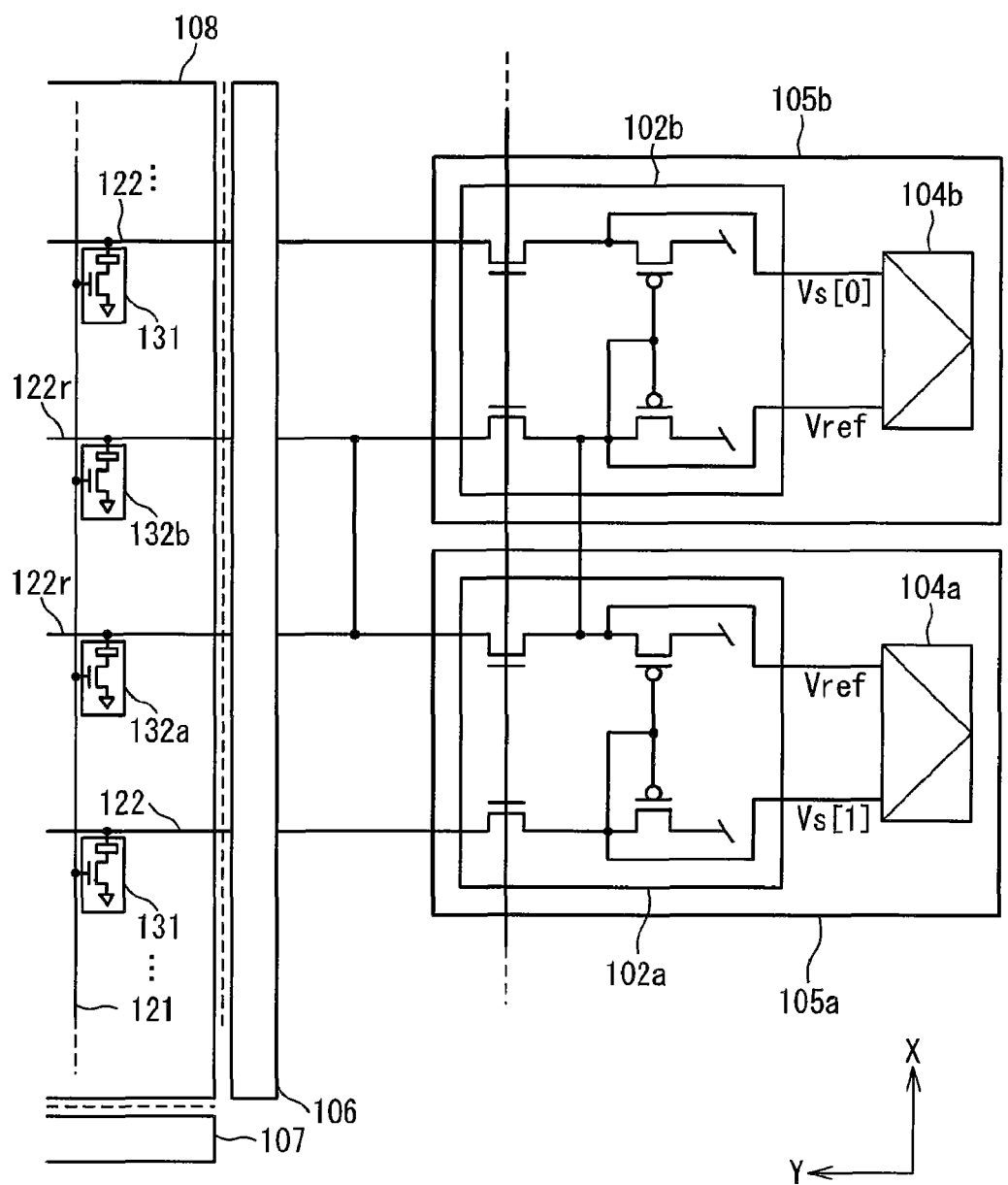
FIG. 1 shows a configuration of an MRAM that includes a read circuit according to a related art.
Figure 2:
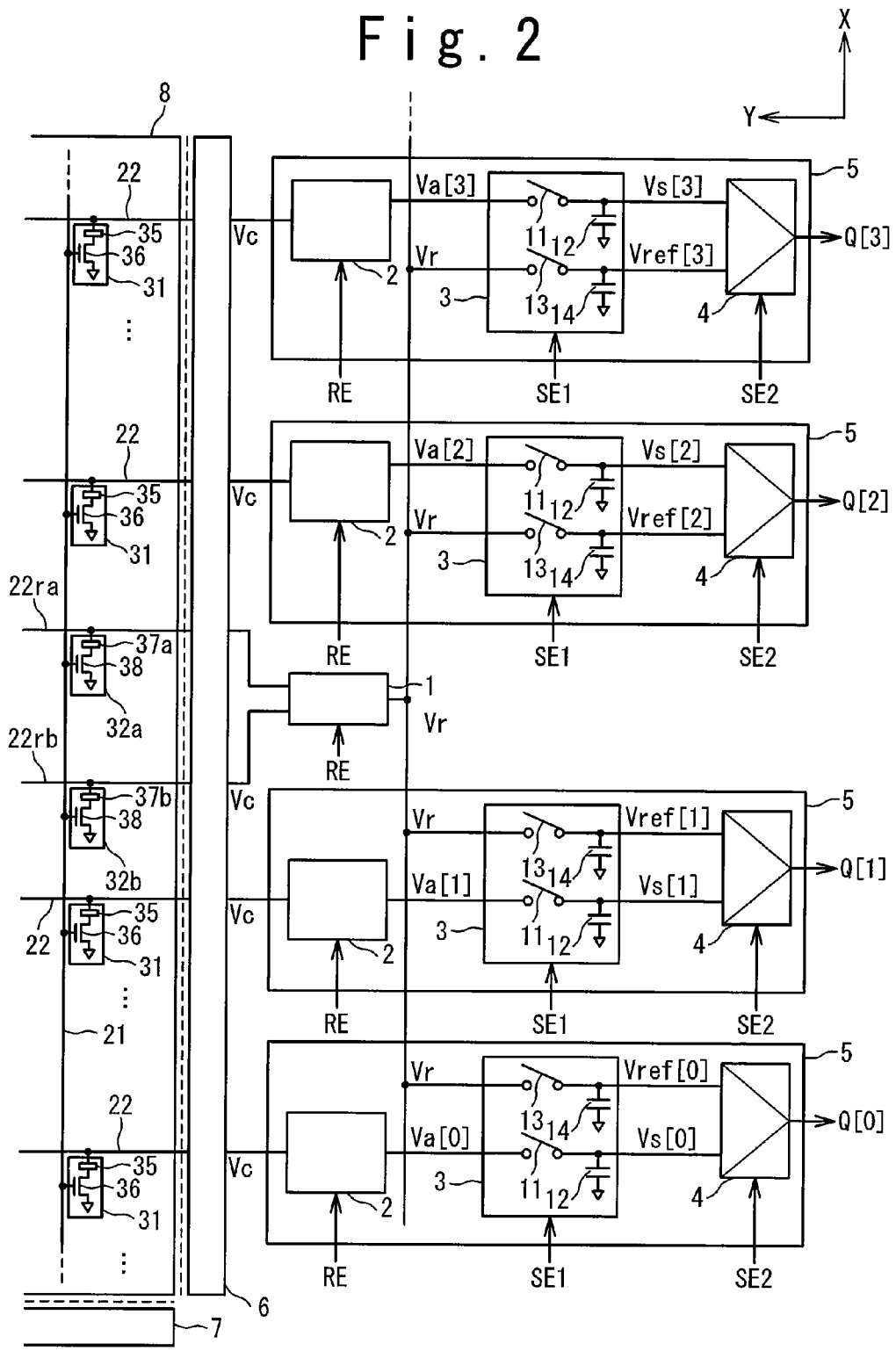
FIG. 2 is a block diagram showing a configuration of a semiconductor memory device according to a first embodiment of the present invention.

FIG. 2 is a block diagram showing a configuration of a semiconductor memory device (MRAM) according to the first embodiment of the present invention. The MRAM is provided with a memory array 8, a row decoder 7, a column decoder 6, a reference current-voltage conversion circuit 1, and read circuits 5.

The memory array 8 includes a plurality of read word lines 21, a plurality of bit lines 22, reference bit lines 22r, a plurality of memory cells 31, and a plurality of reference cells 32.

The plurality of read word lines 21 extend in the X-direction. The plurality of bit lines 22 extend in the Y-direction. The reference bit lines 22r extend in the Y-direction. The plurality of memory cells 31 are provided at respective intersections of the plurality of read word lines 21 and the plurality of bit lines 22. Also, the plurality of reference cells 32 (32a and 32b) are provided at respective intersections of the plurality of read word lines 21 and the reference bit lines 22r (22ra and 22rb).

In the memory cell 31, an MTJ (Magnetic Tunneling Junction) 35 and a MOS transistor 36 are connected in series. The MTJ 35 is a magneto-resistance element whose resistance value changes depending on orientation of spontaneous magnetization. One terminal and the other terminal of the MTJ 35 are connected to the bit line 22 and the MOS transistor 36, respectively. A gate of the MOS transistor 36 is connected to the read word line 21. In the reference cell 32, an MTJ 37 and a MOS transistor 38 are connected in series. One terminal and the other terminal of the MTJ 37 are connected to the reference bit line 22r and the MOS transistor 38, respectively. A gate of the MOS transistor 38 is connected to the read word line 21. The reference cell 32a includes an MTJ 37a to which data "0" is programmed in advance. On the other hand, the reference cell 32b includes an MTJ 37b to which data "1" is programmed in advance. The reference cells 32a and 32b are connected to the reference bit lines 22ra and 22rb, respectively. All but these is the same as the memory cell 31. Here, the two reference cells 32a and 32b are used simultaneously.

The row decoder 7 selects a read word line 21 corresponding to an input row address from the plurality of read word lines 21, as a selected read word line 21s. As a result, the MOS transistors 36 and 38 of the memory cells 31 and the reference cells 32 provided along the selected read word line 21s are turned ON. Additionally, the row decoder 7 selects a write word line corresponding to an input row address from a plurality of write word lines (not shown), as a selected write word line.

The column decoder 6 selects bit lines 22 corresponding to higher-order bits of an input column address from the plurality of bit lines 22, as a plurality of selected bit lines 22s. At the same time, the column decoder 6 selects the reference bit lines 22r (22ra and 22rb).

As a result of the selection by the row decoder 7 and the column decoder 6, the memory cells provided at intersections of the selected read word line 21s and the plurality of selected bit lines 22s are selected as a plurality of selected cells 31s. Also, the reference cells 32 provided at intersections of the selected read word line 21s and the reference bit lines 22r are selected as selected reference cells 32s. Then, the plurality of selected bit lines 22s are respectively connected to current-voltage conversion circuits 2 (described later) of different read circuits 5 through the column decoder 6. As a result, data of the plurality of selected cells 31s are read out to the current-voltage conversion circuits 2. Also, the reference bit lines 22r are connected to the reference current-voltage conversion circuit 1 (described later) through the column decoder 6. As a result, data of the selected reference cells 32s are read out to the reference current-voltage conversion circuit 1.

The reference current-voltage conversion circuit 1 is activated by a read enable signal RE at a time of read operation. The reference current-voltage conversion circuit 1 converts a current value depending on a resistance value of the selected reference cell 32s into a voltage value, and outputs the voltage value as a reference voltage Vr. The reference voltage Vr output from the reference current-voltage conversion circuit 1 is simultaneously input to switch circuits 3 (described later) of all the read circuits 5.

Figure 3:
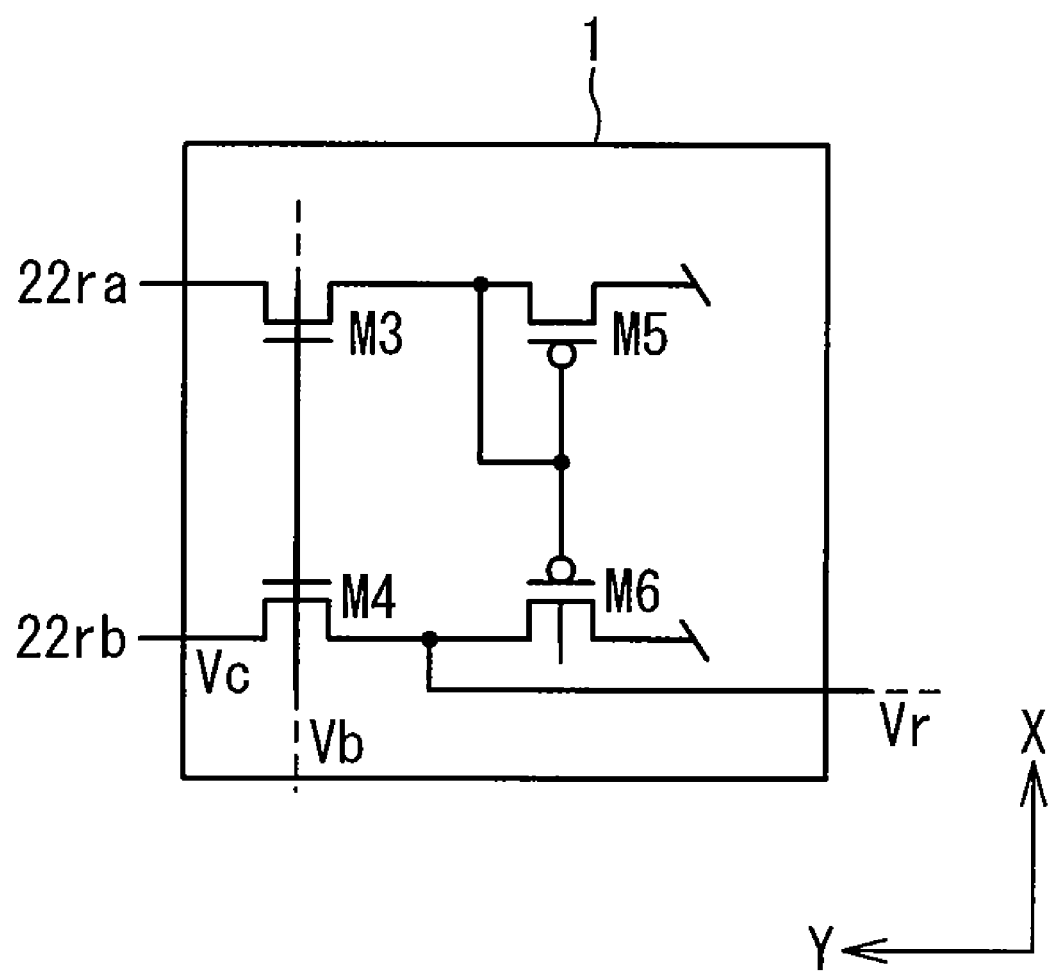
FIG. 3 is a circuit diagram showing one example of a reference current-voltage conversion circuit.

FIG. 3 is a circuit diagram showing one example of the reference current-voltage conversion circuit 1. The reference bit line 22ra is connected to a source of an Nch transistor M3. A drain of the Nch transistor M3 is connected to a drain and a gate of a Pch transistor M5. A source of the Pch transistor M5 is connected to a power source. The reference bit line 22rb is connected to a source of an Nch transistor M4. A drain of the Nch transistor M4 is connected to a drain of a Pch transistor M6. A source of the Pch transistor M6 is connected to the power source. A gate of the Pch transistor M6 is connected to the gate of the Pch transistor M5. An arbitrary bias voltage Vb is applied to gates of the Nch transistors M3 and M4. As a result, those source voltages, namely the voltages of the reference bit lines 22ra and 22rb, are clamped to a predetermined voltage Vc. Consequently, a voltage larger than a predetermined value does not applied to the MTJs 37a and 37b of the reference cells 32a and 32b, which can prevent destruction of the MTJs 37a and 37b. The predetermined voltage Vc is set such that difference between sense currents corresponding to data "0" and "1" takes a maximum value, for example, set to approximately 0.2 V to 0.4 V. The Pch transistors M5 and M6 function as load resistance.

The reference current-voltage conversion circuit 1 outputs the reference voltage Vr that is proportional to half the sum of respective reference currents from the reference cell 32a and the reference cell 32b. That is to say, the reference voltage Vr to be output is proportional to half of the sum of the reference currents respectively flowing through the reference cell 32a to which the data "0" is programmed in advance and the reference cell 32b to which the data "1" is programmed in advance. Here, assume that a sense voltage when the memory cell 31 stores the data "0" is Va(0) and a sense voltage when the memory cell 31 stores the data "1" is Va(1). In this case, the reference voltage Vr output from the reference current-voltage conversion circuit 1 satisfies the following relational expression: Va(0)<Vr<Va(1).

With reference to FIG. 2 again, the read circuit 5 includes the current-voltage conversion circuit 2, the switch circuit 3, and a sense amplifier 4.

At the time of read operation, the current-voltage conversion circuit 2 is activated by the read enable signal RE and connected to the selected memory cell 31s. The current-voltage conversion circuit 2 is a circuit for converting a current value depending on a resistance value of the selected memory cell 31s into a voltage value and outputting the voltage value as a sense voltage Va. The sense voltage Va output from the current-voltage conversion circuit 2 is input to the switch circuit 3. The current-voltage conversion circuit 2 performs control to make a voltage on the input side a constant value (Vc) such that a voltage larger than the predetermined value is not applied to the MTJ 35 of the selected memory cell 31.

The sense voltage Va output from the current-voltage conversion circuit 2 and the reference voltage Vr output from the reference current-voltage conversion circuit 1 are input to the switch circuit 3. The switch circuit 3 temporarily holds those two voltage values. Then, in response to a sense enable signal SE1, the switch circuit 3 cuts off the electrical connection between the current-voltage conversion circuit 2 and the sense amplifier 4 and the electrical connection between the reference current-voltage conversion circuit 1 and the sense amplifier 4. After that, the switch circuit 3 outputs the above-mentioned held two voltage values to the sense amplifier 4. The switch circuit 3 is exemplified by a switched capacitor circuit constituted by a CMOS switch (transfer gate) and a capacitor.

The switch circuit 3 includes switch units 11 and 13 and data retention units 12 and 14. The input side and the output side of the switch unit 11 are connected to the current-voltage conversion circuit 2 and the data retention unit 12 (or the sense amplifier 4), respectively. The switch unit 11 turns ON or OFF the connection between the current-voltage conversion circuit 2 and the data retention unit 12 (or the sense amplifier 4), based on the sense enable signal SE1. When the switch unit 11 is turned ON, the data retention unit 12 temporarily holds the sense voltage Va (or a value corresponding thereto) output from the current-voltage conversion circuit 2. When the switch unit 11 is turned OFF, the data retention unit 12 outputs a sense voltage Vs corresponding to the held sense voltage Va to the sense amplifier 4.

Similarly, the input side and the output side of the switch unit 13 are connected to the reference current-voltage conversion circuit 1 and the data retention unit 14 (or the sense amplifier 4), respectively. The switch unit 13 turns ON or OFF the connection between the reference current-voltage conversion circuit 1 and the data retention unit 14 (or the sense amplifier 4), based on the sense enable signal SE1. When the switch unit 13 is turned ON, the data retention unit 14 temporarily holds the reference voltage Vr (or a value corresponding thereto) output from the reference current-voltage conversion circuit 1. When the switch unit 13 is turned OFF, the data retention unit 14 outputs a reference voltage Vref corresponding to the held reference voltage Vr to the sense amplifier 4.

There are no specific restrictions on the configurations of the switch units 11 and 13 as long as the switch operation is possible. The switch units 11 and 13 are exemplified by a MOS transistor, a CMOS switch (transfer gate) or the like. Also, there are no specific restrictions on the configurations of the data retention units 12 and 14 as long as they can temporarily hold the sense voltage Va and the reference voltage Vr, or voltage values corresponding thereto. The data retention units 12 and 14 are exemplified by a capacitor.

The sense amplifier 4 receives two voltage values (the reference voltage Vref and the sense voltage Vs) from the switch circuit 3. In response to a sense enable signal SE2, the sense amplifier 4 performs the read operation (sense operation) based on those two voltages, the reference voltage Vref and the sense voltage Vs. The sense amplifier 4 then outputs an output data Q that is obtained as a result of the sense operation.

Shown in FIG. 2 is an example where four selected memory cells 31s and a pair of selected reference cells 32s are selected at the time of the read operation. In this case, data of the four selected memory cells 31s are output as the output data Q[1] to Q[4] simultaneously from the four sense amplifiers 4.

Figure 4:
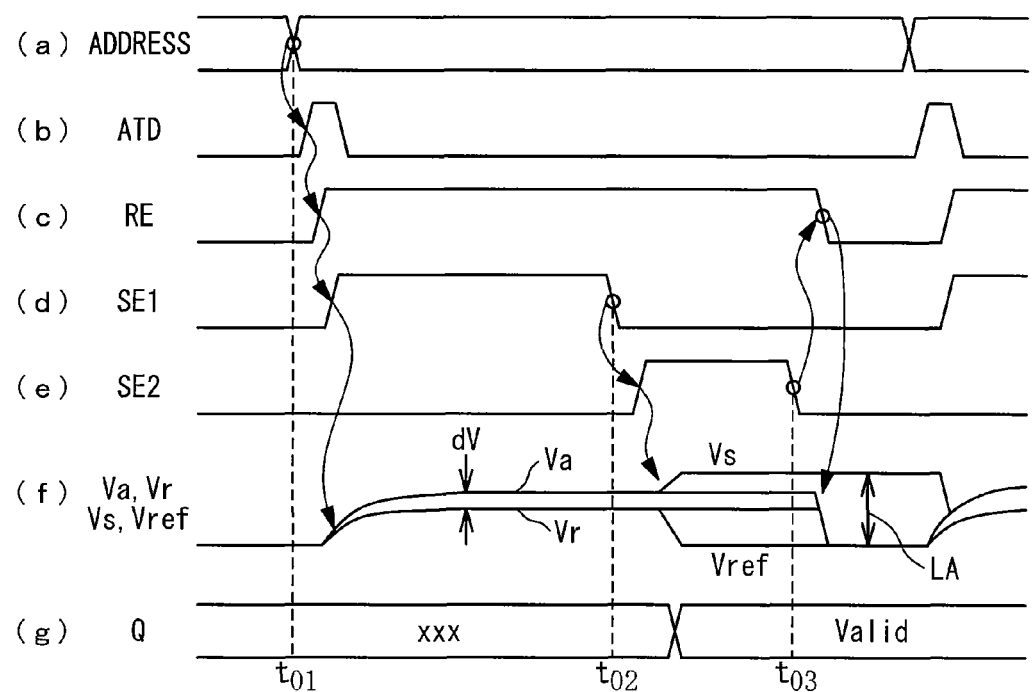
FIG. 4 is a timing chart showing an operation of a read circuit in the semiconductor memory device according to the first embodiment of the present invention.

Next, a method of data reading in the semiconductor memory device according to the exemplary embodiment will be described. FIG. 4 is a timing chart showing an operation of the read circuit 5 according to the present embodiment. In FIG. 4, (a), (b), (c), (d), (e), and (g) show an address signal, an ATD (address transition detection) signal, the read enable signal RE, the sense enable signal SE1, the sense enable signal SE2, and the output data Q, respectively. In addition, (f) shows the sense voltage Va, the reference voltage Vr, the sense voltage Vs, and the reference voltage Vref.

First, at a time t01, a controller (not shown) outputs the address signal to the row decoder 7 and the column decoder 6. The controller also outputs the ATD signal to the row decoder 7 and the column decoder 6 in response to the address signal. In response to the ATD signal, the row decoder 7 selects a selected read word line 21s that corresponds to the address signal. Also, in response to the ATD signal, the column decoder 6 selects a plurality of selected bit lines 22s and reference bit lines 22r that correspond to the address signal. As a result, a plurality of selected cells 31s and reference cells 32 are selected.

Next, the controller sets the read enable signal RE to High level. In response to the read enable signal RE, the current-voltage conversion circuits 2 and the reference current-voltage conversion circuit 1 are activated. The plurality of selected cells 31s are respectively connected to the plurality of current-voltage conversion circuits 2, while the reference cells 32 are connected to the reference current-voltage conversion circuit 1. The current-voltage conversion circuit 2 outputs the sense voltage Va proportional to the sense current that flows through related one of the plurality of selected cells 31s. The reference current-voltage conversion circuit 1 outputs the reference voltage Vr that is proportional to half the sum of the reference currents respectively flowing through the reference cell 32a to which the data "0" is programmed and the reference cell 32b to which the data "1" is programmed.

Next, the controller sets the sense enable signal SE1 to High level. In response to the sense enable signal SE1, the switch units 11 and 13 of the switch circuit 3 are turned ON. At this time, the sense enable signal SE2 is at Low level, and the sense amplifier 4 is in an initialized state. The sense voltage Va output from the current-voltage conversion circuit 2 is held by the data retention unit 12 (charged in the capacitor). Similarly, the reference voltage Vr output from the reference current-voltage conversion circuit 1 is held by the data retention unit 14 (charged in the capacitor). In FIG. 4, the sense voltage Va is larger than the reference voltage Vr, and the difference between the sense voltage Va and the reference voltage Vr is indicated by dV.

Next, at a time t02, the controller sets the sense enable signal SE1 to Low level. In response to the sense enable signal SE1 (Low), the switch units 11 and 13 are turned OFF. At this time, voltages of input terminals of the sense amplifier 4 are maintained at a voltage Vs that is equal to the sense voltage Va and a voltage Vref that is equal to the reference voltage Vr.

Subsequently, the controller sets the sense enable signal SE2 to High level. In response to the sense enable signal SE2, the sense amplifier 4 is activated and makes a comparison between the voltage Vs (sense voltage) and the voltage Vref (reference voltage). A difference between the voltages Vs and Vref input to the sense amplifier 4 is approximately several tens of mV, and the difference is amplified up to a logic amplitude LA in the sense amplifier 4. The difference after the amplification becomes the sense result.

After that, at a time t03, the controller sets the sense enable signal SE2 to Low level. In response to the sense enable signal SE2 (Low), the data retention units 12 and 14 of the switch circuit 3 are reset. Also, the controller sets the read enable signal RE to Low level. In response to the read enable signal RE (Low), the current-voltage conversion circuit 2 and the reference current-voltage conversion circuit 1 are deactivated.

As described above, it is possible by using the above-mentioned switch circuit 3 to separate the outputs of the current-voltage conversion circuit 2 and the reference current-voltage conversion circuit 1 from the input of the sense amplifier 4. As a result, it is prevented that the sense voltage Va and the reference voltage Vr are interfered at the time of the sense operation. Consequently, it is possible to use the one reference voltage Vr as input signals to the plurality of read circuits 5 (sense amplifiers 4). That is to say, it is possible to place a large number of read circuits 5 (sense amplifiers 4) and hence to support the page mode and the burst mode. Moreover, in a case where capacitors are used as the data retention units 12 and 14, the voltages Vs and Vref input to the sense amplifier 4 are determined by charged charges of the capacitors. Therefore, power-supply noise tolerance is also improved. Furthermore, employment of the switch circuit 3 allows greater flexibility in the circuit configuration of the sense amplifier 4.

Moreover, since the switch circuit 3 is provided, it is possible to electrically separate the generation (occurrence) of the sense current and the reference current from the comparison between the sense voltage Vs and the reference voltage Vref in the sense amplifier 4. As a result, it is prevented during the sense operation or the like that the reference cell 32 and the selected cell 31s are electrically connected to each other through the sense amplifier 4. Consequently, it is possible to prevent application of unnecessary voltages to each of the memory cells and prevent the MTJ 35, 37 of each memory cell from being affected.

Second Embodiment

Figure 5:
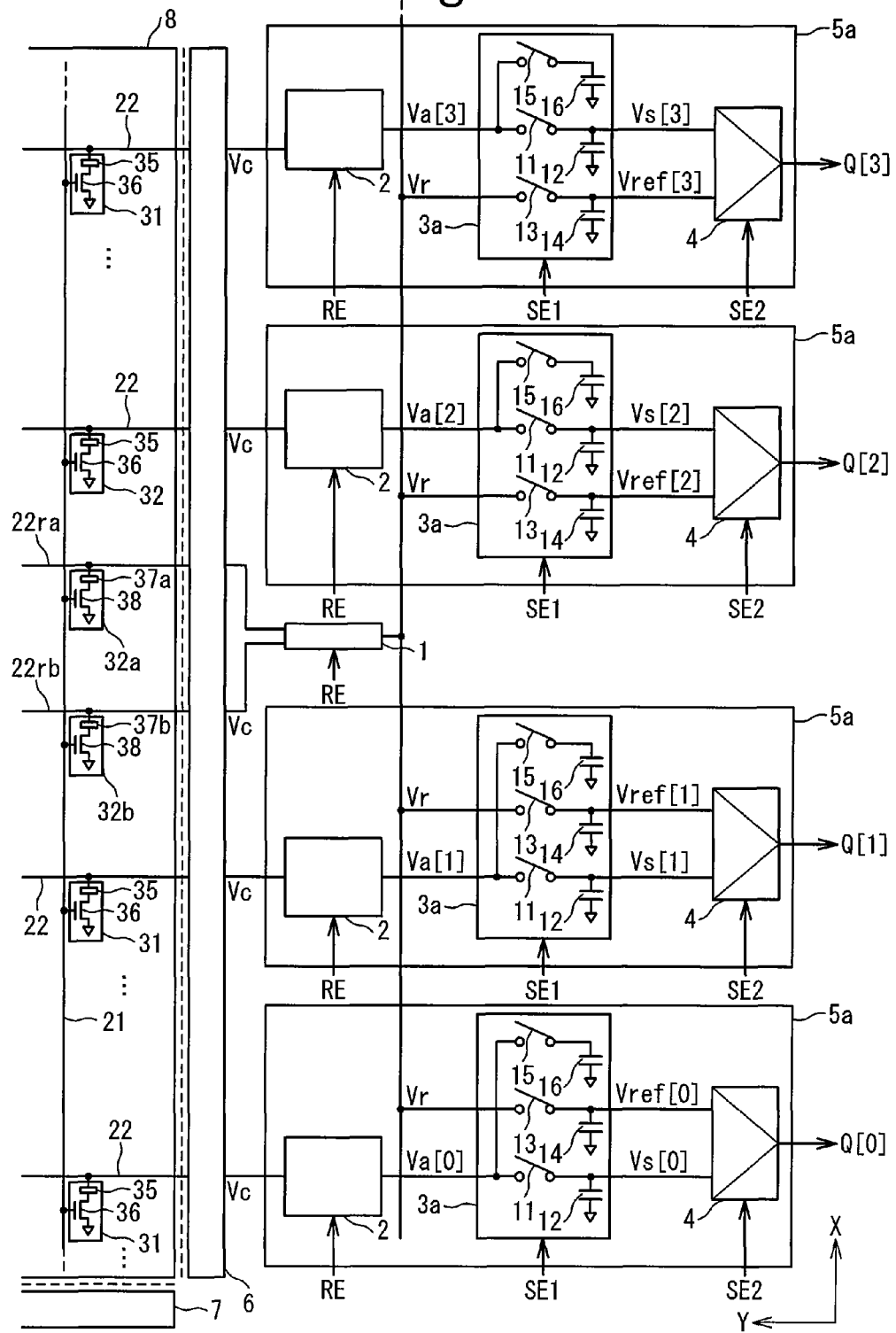
FIG. 5 is a block diagram showing a configuration of a semiconductor memory device according to a second embodiment of the present invention.

FIG. 5 is a block diagram showing a configuration of a semiconductor memory device (MRAM) according to the second embodiment of the present invention. The second embodiment is different from the first embodiment in the following points. That is, a read circuit 5a is provided instead of the read circuit 5 shown in FIG. 2, and the read circuit 5a includes a switch circuit 3a instead of the switch circuit 3. The switch circuit 3a according to the present embodiment further includes a switch unit 15 and a capacitance adjustment unit 16 in addition to the above-mentioned switch units 11, 12, data retention units 13 and 14. The switch unit 15 is connected in parallel to the switch unit 11, and the capacitance adjustment unit 16 is connected to the switch unit 15 in series.

A circuit constituted by the switch unit 15 and the capacitance adjustment unit 16 (hereinafter referred to as a dummy circuit) is provided at a subsequent stage of the current-voltage conversion circuit 2. The dummy circuit is used for substantially equalizing the loads of the reference current-voltage conversion circuit 1 and the current-voltage conversion circuit 2. In a case where the output of the reference current-voltage conversion circuit 1 is connected to N switch circuits 3a, for example, the output is connected to N data retention units (capacitors) 14. When a capacitance value of the capacitor 12 is the same as that of the capacitor 14, a capacitance value of the capacitance adjustment unit 16 is set to approximately (N−1) times the capacitance value of the capacitor 12. In this case, settling times of the sense voltage Va and the reference voltage Vr become substantially equal to each other.

Figure 6A:
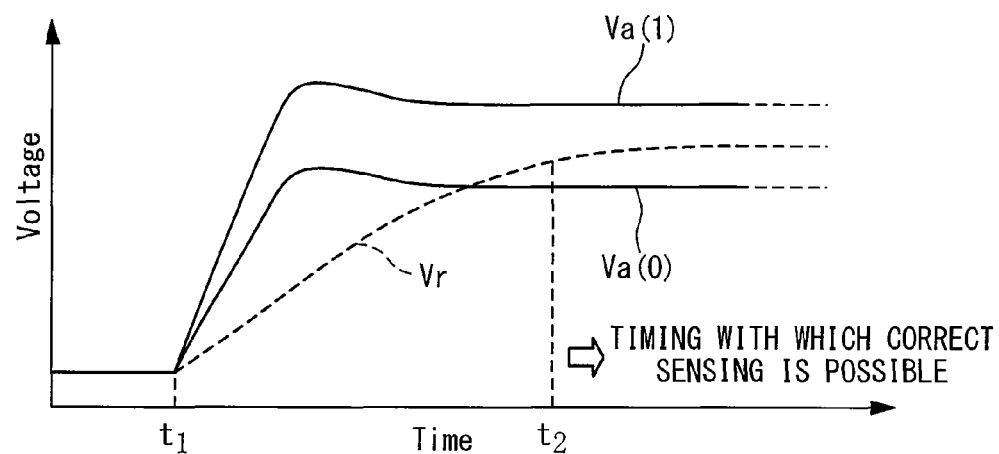
FIG. 6A is a graph showing time variation of voltage in a data retention unit of a switch circuit according to the first embodiment.
Figure 6B:
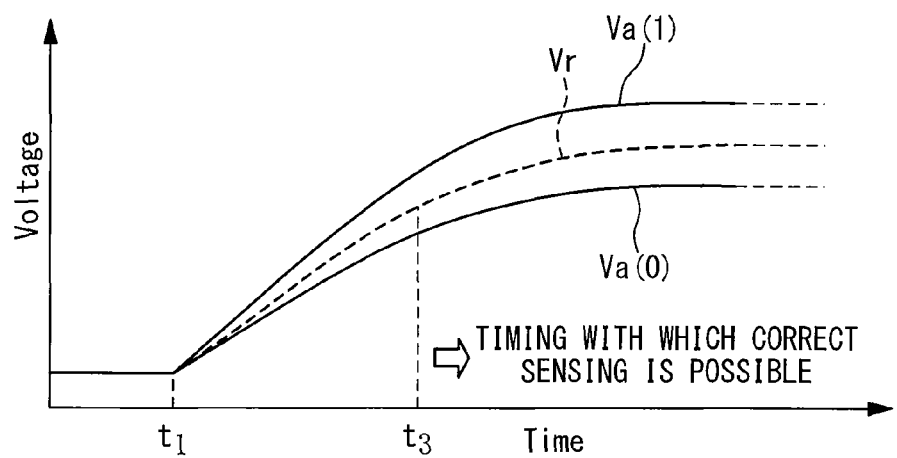
FIG. 6B is a graph showing time variation of voltage in a data retention unit of a switch circuit according to the second embodiment.

FIGS. 6A and 6B are graphs showing time variation of voltage in the data retention unit of the switch circuit. FIG. 6A is a graph regarding the capacitor of the data retention unit in the first embodiment (see FIG. 2), while FIG. 6B is a graph regarding the capacitor of the data retention unit in the second embodiment (see FIG. 5). The vertical axis indicates the voltage of the capacitor of the data retention unit, while the horizontal axis indicates time.

At a time t1, the sense voltage Va and the reference voltage Vr are input to the switch circuit. According to the first embodiment, the switch circuit 3 does not have the dummy circuit. In this case, the settling time (time required for enabling correct sensing) of the reference voltage Vr becomes relatively long, as shown in FIG. 6A. Therefore, it is necessary to turn OFF the switch units 11, 13 and make the sense amplifier 4 operate after the reference voltage Vr is sufficiently set. In FIG. 6A, it is necessary to wait until a time t2. According to the second embodiment on the other hand, the switch circuit 3a has the dummy circuit. Therefore, as shown in FIG. 6B, magnitude relationship between the sense voltage Va and the reference voltage Vr is maintained even at a time when the reference voltage Vr is not sufficiently set. For this reason, it is possible to correctly perform the sense operation even if the switch units 11, 13 are turned OFF to make the sense amplifier 4 operate earlier than the settling time of the sense voltage Va and the reference voltage Vr. In FIG. 6B, the sense operation can be started at a time t3, which is earlier than the time t2.

The method of reading data from the semiconductor memory device according to the present embodiment is the same as the method according to the first embodiment, and detailed description thereof is omitted (refer to FIG. 4). It should be noted that the timing of turning OFF the switch units 11, 13 and operating the sense amplifier 4 can be made earlier as compared with the case of the first embodiment.

According to the second embodiment, the same effects as in the first embodiment can be obtained. In addition, the timing of turning OFF the switch units 11, 13 and making the sense amplifier 4 operate can be made earlier. It is therefore possible to reduce the time required for the sense operation.

Third Embodiment

Figure 7:
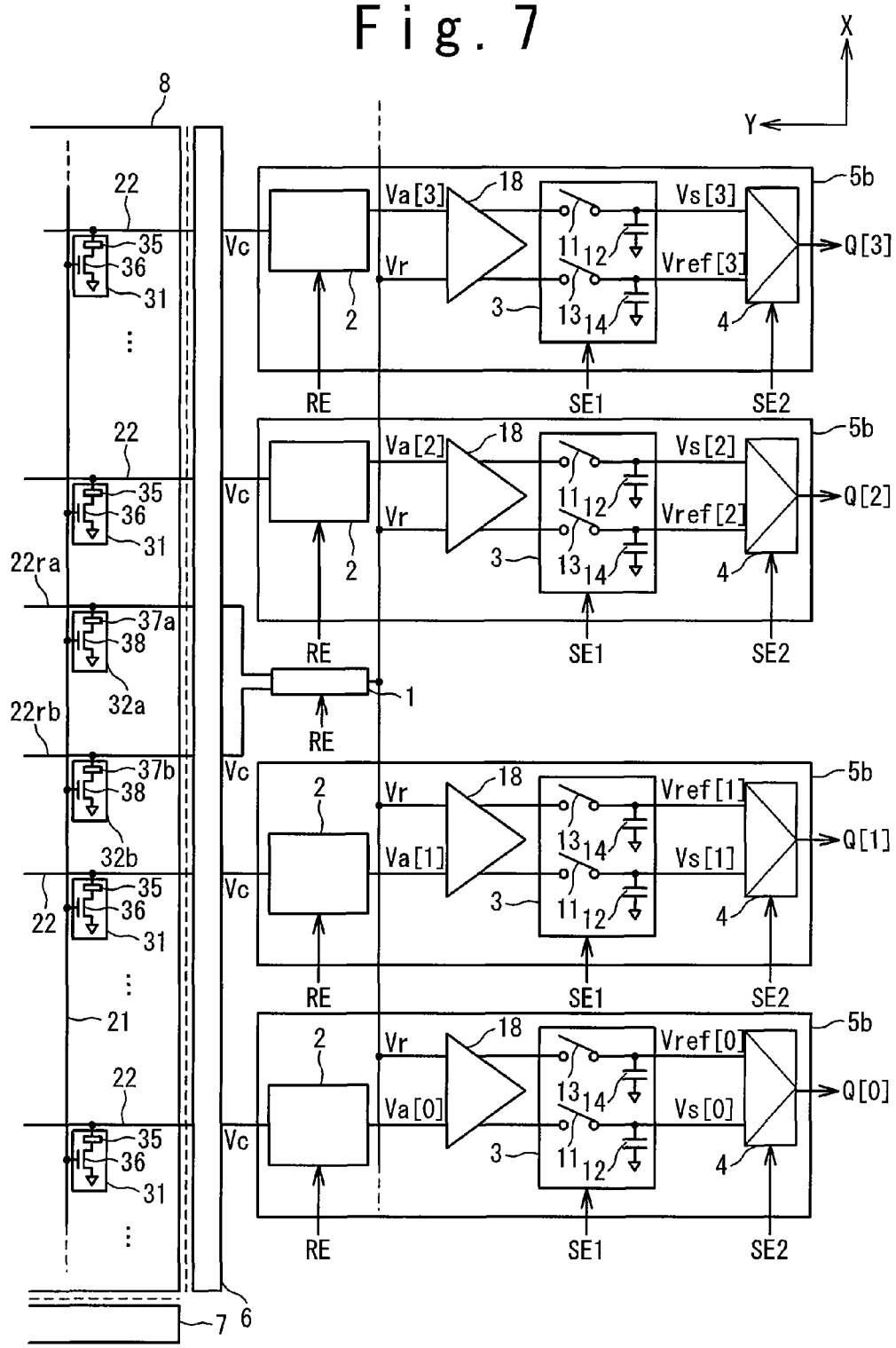
FIG. 7 is a block diagram showing a configuration of a semiconductor memory device according to a third embodiment of the present invention.

FIG. 7 is a block diagram showing a configuration of a semiconductor memory device (MRAM) according to the third embodiment of the present invention. The third embodiment is different from the first embodiment in the following points. That is, a read circuit 5b is provided instead of the read circuit 5 shown in FIG. 2. The read circuit 5b includes an amplification circuit 18 with differential output in addition to the components in the read circuit 5 shown in FIG. 2. The amplification circuit 18, which is provided between the current-voltage conversion circuit 2 and the switch circuit 3, amplifies a voltage difference between the sense voltage Va output from the current-voltage conversion circuit 2 and the reference voltage Vr output from the reference current-voltage conversion circuit 1.

In the MRAM, the signal difference between the data "0" and the data "1" is small, and the voltage difference between the sense voltage Va and the reference voltage Vr is at most several tens of mV. A voltage difference between an output voltage Va' and an output voltage Vr' of the amplification circuit 18 with differential output is equal to an arbitrary constant times the voltage difference between the sense voltage Va and the reference voltage Vr. Therefore, the voltage difference of several tens of mV can be increased up to several hundreds of mV, which makes it possible to greatly secure a circuit margin of the sense amplifier 4 at a subsequent stage. Moreover, it is possible by providing the amplification circuit 18 to decrease the gains of the current-voltage conversion circuit 2 and the reference current-voltage conversion circuit 1. Consequently, it is possible to expand an input range of the read circuit 5b, namely, a range of the resistance value of the MTJ 35, 37 which can be sensed.

The method of reading data from the semiconductor memory device according to the present embodiment is the same as the method according to the first embodiment, and detailed description thereof is omitted (refer to FIG. 4). It should be noted that the voltage difference between the sense voltage Va and the reference voltage Vr is amplified by the amplification circuit 18, and the output voltage Va' and the output voltage Vr' from the amplification circuit 18 are input to the switch circuit 3 (sense amplifier 4).

According to the present embodiment, the same effects as in the first embodiment can be obtained. In addition, it is possible to greatly secure the circuit margin of the sense amplifier 4 at a subsequent stage and to expand the range of the resistance value of the MTJ 35, 37 which can be sensed.

As described above, the differential output of the amplification circuit 18 is input to the switch circuit 3, and the sense voltage Va, Va' and the reference voltage Vr, Vr' are not interfered at the time of operation of the sense amplifier 4. Therefore, the reliability of data reading is not deteriorated even when the one reference voltage Vr is used as the input signals to the plurality of sense amplifiers 4 (read circuits 5).

It is also possible to combine the second embodiment and the third embodiment. In this case, the both effects by the second embodiment and the third embodiment can be obtained.

It should be noted that the present invention is not limited to the above-described embodiments. Design may be changed without departing from the scope of the invention. For example, the present invention is not limited to the MRAM but is applicable to any memory using the resistance change such as an OUM and an RRAM.

Although the case where the reference voltage Vr is shared by four read circuits is described in the foregoing embodiments, there is no limitation on the number of read circuits that share the one reference voltage Vr. Also, a variety of circuits which are conventionally known can be used as the current-voltage conversion circuit. Also, a cell of the MRAM is not limited to the shown 1TR1MTJ cell, but may be a cross point cell that does not include a select transistor, for instance.

The invention claimed is:

1. A semiconductor memory device comprising:
   a memory array including a plurality of memory cells and a reference cell each of which has a memory element that stores data based on change in resistance value;
   a plurality of read circuits configured to read respective data of a plurality of selected cells that are selected from said plurality of memory cells; and
   a first current-voltage conversion circuit provided at a subsequent stage of a decoder relating to selection of said plurality of selected cells and configured to output a reference voltage corresponding to a reference current flowing through said reference cell,
   wherein said first current-voltage conversion circuit distributes said reference voltage to said plurality of read circuits in common,
   wherein each of said plurality of read circuits includes:
   a second current-voltage conversion circuit provided at a subsequent stage of said decoder and configured to output a sense voltage corresponding to a sense current flowing through a coupled one of said plurality of selected cells;
   a voltage comparison unit configured to compare said sense voltage with said reference voltage;
   a first switch circuit provided between said first current-voltage conversion circuit and said voltage comparison unit, the first switch circuit controlling connection between said first current-voltage conversion circuit and said voltage comparison unit by switching on or off; and
   a second switch circuit provided between said second current-voltage conversion circuit and said voltage comparison unit, said second switch circuit controlling connection between said second current-voltage conversion circuit and said voltage comparison unit by switching on or off.

2. The semiconductor memory device according to claim 1, wherein said reference cell includes:
   a first reference cell in which said resistance value is set to a first state; and
   a second reference cell in which said resistance value is set to a second state,
   wherein when said first reference cell and said second reference cell are selected simultaneously, said first current-voltage conversion circuit outputs a voltage corresponding to half a sum of a first reference current flowing through said first reference cell and a second reference current flowing through said second reference cell as said reference voltage.

3. The semiconductor memory device according to claim 1, wherein each of said plurality of read circuits further includes an amplification circuit provided at a preceding stage of said voltage comparison unit,
   wherein said amplification circuit amplifies said sense voltage and said reference voltage such that a difference between said sense voltage and said reference voltage is increased.

4. The semiconductor memory device according to claim 1, wherein when said first current-voltage conversion circuit is connected to said reference cell and each of said plurality of read circuits is connected to the coupled one of said plurality of selected cells, said second switch circuit and said first switch circuit are turned on, thereafter said second switch circuit and said first switch circuit are turned off, thereafter said voltage comparison unit compares said sense voltage with said reference voltage in said each read circuit.

5. The semiconductor memory device according to claim 1, wherein said first switch circuit includes:
   a first switch element provided between an input side and an output side; and
   a first capacitor whose one terminal is grounded and the other terminal is connected to said output side of said first switch element,
   wherein said second switch circuit includes:
   a second switch element provided between an input side and an output side; and
   a second capacitor whose one terminal is grounded and the other terminal is connected to said output side of said second switch element.

6. The semiconductor memory device according to claim 5, wherein said second switch circuit further includes:
   a third capacitor whose one terminal is grounded; and
   a third switch element provided between said input side of said second switch element and the other terminal of said third capacitor.

7. The semiconductor memory device according to claim 6, wherein in a sense operation, when said second switch element is in a connected state, said third switch element is also in a connected state.

8. The semiconductor memory device according to claim 6, wherein a number of said plurality of read circuits to which said reference voltage is input from said first current-voltage conversion circuit in a sense operation is N (N is an integer not less than 2),
   wherein a capacitance value of said first capacitor and said second capacitor is C, and a capacitance value of said third capacitor is C(N−1).

9. The semiconductor memory device according to claim 1, wherein in a sense operation, said first current-voltage conversion circuit outputs said reference voltage simultaneously to said plurality of read circuits.

10. The semiconductor memory device according to claim 1, wherein said memory element is a magneto-resistance element whose resistance value changes depending on orientation of spontaneous magnetization.

11. The semiconductor memory device according to claim 1, wherein said memory element is a phase change element whose resistance value changes due to change in crystal state by heating.

* * * * *